United States Patent [19]
Igarashi

[11] Patent Number: 4,656,491
[45] Date of Patent: Apr. 7, 1987

[54] PROTECTION CIRCUIT UTILIZING DISTRIBUTED TRANSISTORS AND RESISTORS

[75] Inventor: Hatsuhide Igarashi, Tokyo, Japan

[73] Assignee: NEC Corporation, Tokyo, Japan

[21] Appl. No.: 552,876

[22] Filed: Nov. 17, 1983

[30] Foreign Application Priority Data

Nov. 18, 1982 [JP] Japan ................... 57-202686

[51] Int. Cl.⁴ ........................................... H01L 29/78
[52] U.S. Cl. ................... 357/23.13; 357/23.8; 357/23.14; 357/51; 357/35; 357/36; 357/41; 307/200 A; 307/542; 307/549; 307/551
[58] Field of Search ............... 307/200 A, 542, 549, 307/551; 357/23.13, 23.14, 23.1, 36, 51, 41, 35, 23.8

[56] References Cited

U.S. PATENT DOCUMENTS

| | | |
|---|---|---|
| 3,636,385 | 1/1972 | Koepp ................ 357/23.13 |
| 3,673,427 | 6/1972 | McCoy et al. .......... 357/23.13 |
| 3,748,567 | 7/1973 | Sugimoto ............ 357/23.13 X |
| 3,778,688 | 12/1973 | Crawford ............ 357/35 X |
| 4,066,918 | 1/1978 | Heuner et al. ........ 357/23.13 |
| 4,107,719 | 8/1978 | Graul et al. .......... 357/35 X |
| 4,131,908 | 12/1978 | Daub et al. .......... 357/42 |
| 4,145,702 | 3/1979 | Rau, III et al. ........ 357/35 X |
| 4,202,005 | 5/1980 | Sanders .............. 357/36 |
| 4,456,939 | 6/1984 | Ozaki et al. .......... 357/23.13 |

Primary Examiner—Martin H. Edlow
Assistant Examiner—William A. Mintel
Attorney, Agent, or Firm—Sughrue, Mion, Zinn, Macpeak and Seas

[57] ABSTRACT

A protection circuit is composed of first and second regions formed in a semiconductor substrate so as to be operable as distributed transistors which have a large current capacity as a whole. Compared with the concentrated transistor used in the prior art, a much greater degree of protection is provided.

10 Claims, 9 Drawing Figures

PROTECTION CIRCUIT UTILIZING DISTRIBUTED TRANSISTORS AND RESISTORS

BACKGROUND OF THE INVENTION

This invention relates to a semiconductor device provided with a protection circuit, and more particularly to a construction of the protection circuit which protects a semiconductor element such as a MOS field effect transistor (hereinafter referred to as a MOS FET) from a high voltage applied abruptly thereto.

A semiconductor integrated circuit (hereinafter referred to as an IC) is apt to be damaged by an abnormally high voltage applied thereto. In particular, an IC having MOS FETs as circuit elements can be easily destroyed by a surge voltage due to resulting high levels of electrostatic charges. For preventing such damage, various protection circuits have been proposed. These conventional protection circuits were generally constructed with a resistor and a switch such as a transistor which turns on in response to a voltage higher than a predetermined voltage.

Figure 1:
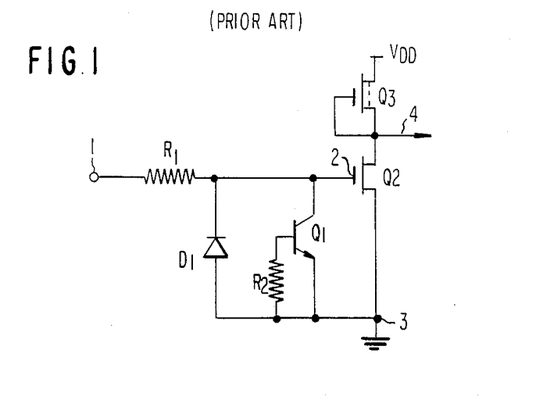
FIG. 1 is an equivalent circuit diagram of an input portion of an IC of the prior art.

One such conventional protection circuit is shown in FIG. 1, and will be explained hereunder with reference to FIGS. 1, 2 and 3. MOS FET's $Q_2$ and $Q_3$ constitute an inverter as an input stage of a circuit formed on a semiconductor chip. The source electrode of the MOS FET $Q_2$ is grounded at a ground terminal. The drain electrode of the MOS FET $Q_3$ is connected to a power supply terminal $V_{DD}$. The source electrode of the MOS FET $Q_3$ and the drain electrode of the MOS FET $Q_2$ are connected to each other to supply a signal obtained at the connection point 4 to the following circuit (not shown) formed on the same semiconductor chip. Between an input terminal 1 and the gate electrode 2 of the MOS FET $Q_2$, a resistor $R_1$ formed by an impurity diffusion is inserted. A diode $D_1$ and a protection transistor $Q_1$ are connected between the gate electrode 2 of the MOS FET $Q_2$ and the ground terminal 3. The protection transistor $Q_1$ is an NPN type bipolar transistor having a collector connected to the gate electrode 2 of the MOS FET $Q_2$, an emitter grounded at the ground terminal 3 and a base connected to the ground terminal 3 through a resistor $R_2$.

Figure 2:
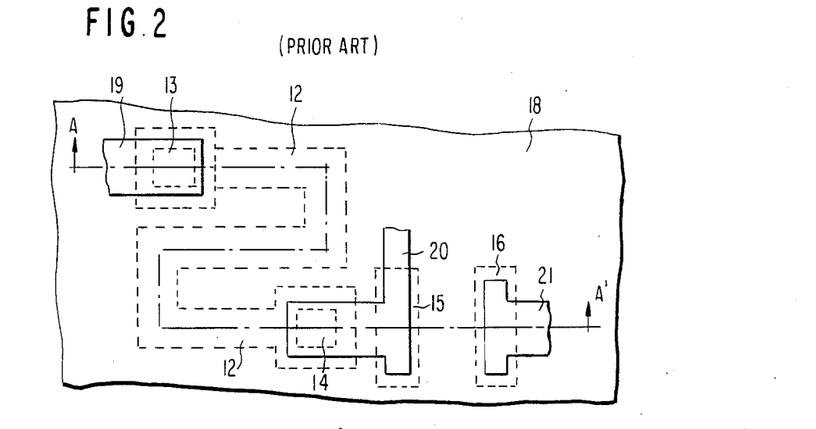
FIG. 2 is a plan view of the input portion of the IC shown in FIG. 1.
Figure 3:
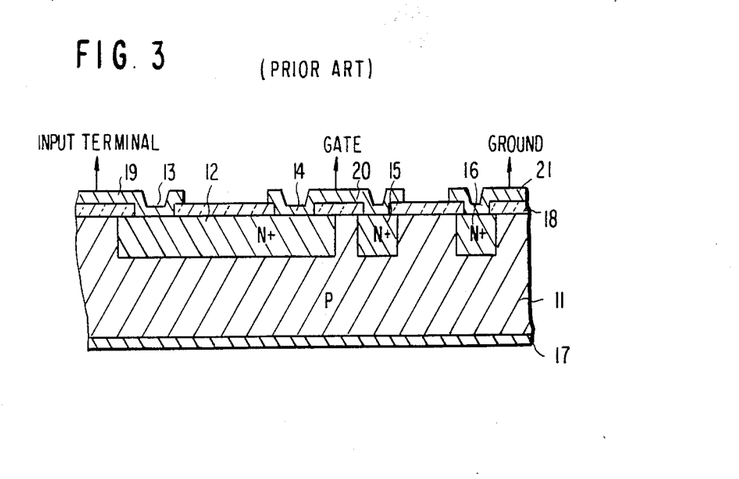
FIG. 3 is a sectional view of the IC shown in FIG. 2.

This protection circuit is realized on a semiconductor substrate 11 as shown in FIGS. 2 and 3. An N+ region 12 operating as the resistor $R_1$, and N+ regions 15 and 16 operating respectively as the collector and the emitter of the protection transistor $Q_1$ are formed in the P-type semiconductor substrate 11. The N+ region 16 is connected to the ground terminal 3 (not shown in FIGS. 2 and 3) through an Al wiring layer 21. The N+ region 15 and a contact region 14 provided at one end of the N+ region 12 are commonly connected to an Al wiring layer 20 to make connection to the gate electrode of the MOS FET $Q_2$ (not shown in FIGS. 2 and 3). A contact region 13 provided at the other end of the N+ region 12 is connected to the input terminal 1 (not shown in FIGS. 2 and 3) with an Al wiring layer 19. The substrate 11 is grounded by way of a metal layer 17 formed on its back surface. The wiring layers 19, 20 and 21 are disposed on a field insulator film 18 formed on the substrate 11 and connected with the N+ regions 12, 15 and 16 through windows of the field insulator film 18. It should be noted that the resistor $R_2$ in FIG. 1 is an effective resistance component of a portion of the substrate 11 operating as the base of the protection transistor $Q_1$ and that the diode $D_1$ is formed by a PN-junction between the N+ region 15 and the substrate 11.

The resistor $R_1$, the diode $D_1$, the protection transistor $Q_1$ and the resistor $R_2$ constitute a protection circuit for protecting the MOS FET $Q_2$, especially for protecting the gate insulator film of the MOS FET $Q_2$, from an abnormally high voltage which is accidentally or unexpectedly applied to the input terminal 1. When a high positive voltage is applied to the input terminal 1, the PN-junction between the N+ region 15 and the substrate 11 is broken down, causing injection of electrons into the substrate 11. Due to this injection, the potential of the substrate between the N+ regions 15 and 16 rises due to the resistance component $R_2$ to bias forwardly the PN-junction between the N+ regions 16 and the substrate 11. As a result, a lateral type NPN transistor ($Q_1$) formed by the N+ regions 15 and 16 and the portion of the substrate therebetween turns on, forming a current path from the N+ region 15 to the ground through the substrate 11, the N+ region 16 and the wiring layer 21. This current path lowers the voltage at the gate electrode of the MOS FET $Q_2$, resulting in protection of the MOS FET $Q_2$.

On the other hand, when a high negative voltage is applied to the input terminal 1, the PN-junction of the N+ region 12 and the substrate 11 is forwardly biased. Consequently, the diode $D_1$ turns on, forming a current path through the PN-junction. The presence of this current path also lowers the voltage at the gate electrode of the MOS FET $Q_2$. In this way, if either a positive or a negative high voltage is applied to the input terminal 1, the protection circuit protects the MOS FET $Q_2$.

As IC technology has advanced, however, the integration density and the operation speed semiconductor devices has been improved. These improvements have been realized by minimizing the size of MOS FET's. As a result, recent types of MOS FET's have become more sensitive to an applied voltage and require more effective protection circuits.

The conventional protection circuit uses a discrete transistor as the protection transistor $Q_1$. Such a discrete transistor has a comparatively small current capacity. If an input having a large voltage is applied to the input terminal 1, the protection transistor may be thermally destroyed by excessive current, or the voltage rise at the collector may cause damage the MOS FET $Q_2$.

Various improvements of the protection circuit have been proposed. In one proposed improvement, the resistance of the resistor $R_1$ is increased. A The large resistance, however, makes the operation speed of the circuit in an IC slow. This is because the operation speed of the MOS FET $Q_2$ is determined by RC time constant of the protection circuit. Therefore, the best solution in the prior art has been a compromise between protecting against excessive input voltages and the operation speed of the IC, i.e., between increasing the size of the protection transistor $Q_1$ and the increased resistance of the resistor $R_1$. This is not a completely satisfactory solution since a large area for is required the protection circuit, resulting in an overall reduction of integration density.

SUMMARY OF THE INVENTION

The principal object of the present invention is to provide a protection circuit which does not decrease the operation speed of an IC, which reliably lowers the voltage of an input signal having an abnormally high voltage, and which survives in the present of an abnormally high voltage input signal.

Another object of the present invention is to provide a protection circuit which may be realized within a small area of an IC.

The present invention provides a semiconductor device having such a protection circuit. The inventive semiconductor device includes a semiconductor substrate of one conductivity type, with a transistor formed on the semiconductor substrate. The transistor has a first terminal for making connection with the external circuit, which terminal is formed on the semiconductor substrate. The substrate includes a first region of the other conductivity type which is divided into a first and a second end portion. The first terminal is connected to the first end portion of the first region, and the second end portion of the first region is connected to the transistor. A second region of the other conductivity type is formed in the semiconductor substrate and has a first end portion which is kept electrically floating. The second region further has a second end portion at a location closer to the transistor than the first end portion of the second region. The second end portion of the second region is connected to the second terminal. The first and second regions are separated by such a distance that punch-through phenomenon does not occur but that transistor action may nonetheless occur. A second terminal formed on the semiconductor substrate for connection to a reference voltage source.

According to the present invention, since the first end portion of the second region is kept in an electrically floating condition, the first and second regions operate as a distributed transitor in response to application of abnormally high voltage. The distributed transistor has elongated collector and emitter regions of a length sufficient to conduct a large current. Therefore, the voltage at the second end portion of the first region is reliably decreased without an increase of the resistance between the first and second end portions of the first region. Further, the resistance between the first and second end portions may be decreased without loss of reliability of the protection operation. This means that the occupied by the protection circuit can be decreased and that the operation speed of the transistor is not lowered and indeed may be improved. Furthermore, since the distributed transistor has a large current capacity, the distributed transistor with not be damaged by an abnormally high voltage applied at the first terminal. Accordingly, the protection circuit itself will be destroyed by the abnormally high voltage.

BRIEF DESCRIPTION OF THE DRAWINGS

The above and other objects and features of the invention will become more apparent from the following description taken in conjunction with the accompanying drawings; wherein.

DESCRIPTION OF THE PREFERRED EMBODIMENTS

Figure 4:
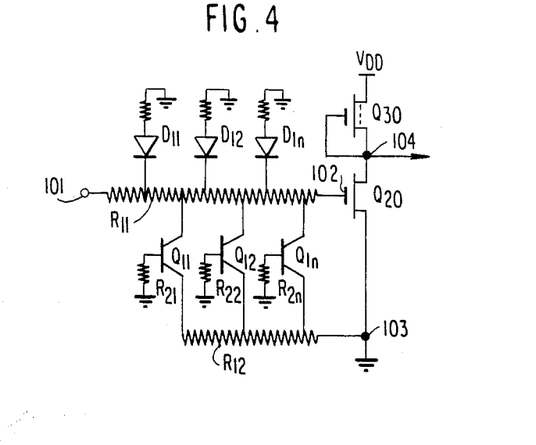
FIG. 4 is an equivalent circuit diagram of an input portion of an IC according to a first embodiment of the present invention.

The first embodiment shown in FIGS. 4, 5, 6A, and 6B has a number of transistors $Q_{20}$, $Q_{30}$ ... formed on a P-type silicon substrate 110 having an impurity concentration of $2 \times 10^{15}$ cm$^{-3}$. FIG. 4 shows two transistors $Q_{20}$ and $Q_{30}$ only. The transistor $Q_{20}$ is an N-channel enhancement type MOS FET receiving an input signal at its gate electrode 102 and which operates as a first stage transistor. The transistor $Q_{30}$ is an N channel depletion type MOS FET operating as a load of the MOS FET $Q_{20}$. These MOS FET's $Q_{20}$ and $Q_{30}$ are connected in series between the terminal receiving a power supply voltage $V_{DD}$ and a ground terminal 103. A signal obtained at a connection point 104 of the gate and source electrodes of the MOS FET $Q_{30}$ and the drain electrode of the MOS FET $Q_{20}$ is supplied to one or more other transistors (not shown in FIG. 4). In the silicon substrate 110, N+ regions 31 and 32 having an impurity concentration of $10^{20}$ cm$^{-3}$ are also formed to provide resistors $R_{11}$ and $R_{12}$. One end portion of the N+ region 32 (the resistor $R_{12}$) is connected to the ground terminal 103 through an Al wiring layer 38. The other end portion of the N+ region 32 is a free end kept in an electrically floating condition. The N+ region 31 (the resistor $R_{11}$) has one end portion connected to the gate electrode of the MOS FET $Q_{20}$ through an Al wiring layer 37 and the other end portion connected, through an Al wiring layer 36, to an input terminal 101 which is formed on the silicon substrate 110 through an insulator film 180 such as SiO$_2$. The N+ regions 31 and 32 are disposed parallel to each other. The distance between these elongated regions 31 and 32 is selected so as to prevent punch-through from occurring between the regions 31 and 32 and so as to allow the regions 31 and 32 to operate as a lateral transistor. This distance is, for example, 15μm. The region 32 should have a region free from contact with the wiring layer 38. This contact free portion functions as a wide emitter region of the distributed transistors $Q_{11}$, $Q_{12}$ ... $Q_{1n}$. The contact free portion should have a length of 50 to 150 μm to give a sufficient current capacity to the distributed transistors $Q_{11}$, $Q_{12}$ ... $Q_{1n}$ as a whole. One example of this length is 100 μm. The distributed transistors $Q_{11}$, $Q_{12}$ ... $Q_{1n}$ are lateral NPN transistors having collectors formed by the N+ region 31, bases by the silicon substrate 110 and emitters by the N+ region 32. The resistors $R_{21}$, $R_{22}$ ... $R_{2n}$ are effective resistors formed by the portions of the silicon substrate operating as the bases. The N+ region 31 and the silicon substrate 110 form distributed diodes $D_{11}$, $D_{12}$ ... $D_{1l}$ having series resistors. The silicon substrate 110 has a metal electrode 170 on its rear surface.

The operation of the above-explained first embodiment will be now described. If an abnormally high positive voltage is applied to the input terminal 101, the PN junction between the N+ region 31 and the silicon substrate 110 breaks down, causing injection of carriers into the silicon substrate 110. As a result, the potential at the substrate 110 rises to forward bias the PN-junction between the N+ region 32 and the substrate 110, turning on the distributed lateral NPN transistors $Q_{11}$, $Q_{12}$ ... $Q_{1n}$. Here, the N+-type region 32 has the contact free portion on the left which operates as emitter resistors of the distributed transistors $Q_{11}$, $Q_{12}$ ... $Q_{1n}$, the distributed transistor $Q_{1n}$ close to the MOS FET $Q_{20}$ has a small emitter resistance and the distributed transistor $Q_{11}$ far from the MOS FET $Q_{20}$ has a large emitter resistance. Although the distributed transistors far from the MOS FET $Q_{20}$ receive high collector voltages compared to the distributed transistors close to the MOS FET $Q_{20}$, the effective current gains of the distributed transistors far from the MOS FET $Q_{20}$ are suppressed to a small value by the feedback effect of the emitter resistors, resulting in equalization of currents flowing through all the distributed transistors $Q_{11}$, $Q_{12}$ ... $Q_{1n}$. This means that, if an abnormally high input voltage is applied to the input terminal 101, no concentration of current flow occurs among the distributed transistors $Q_{11}$, $Q_{12}$ ... $Q_{1n}$. The distributed transistors $Q_{11}$, $Q_{12}$ ... $Q_{1n}$ have a large current capacity as a whole. Therefore, the protection circuit is not damaged by the abnormally high voltage input. The high input voltage is reliably decreased by the distributed transistors $Q_{11}$, $Q_{12}$ ... $Q_{1n}$. This decrease may be achieved without an increase of the resistance of the resistor $R_{11}$. On the contrary, the resistance of the resistor $R_{11}$ may be made small. Consequently, the protection circuit may be realized in a small area of the IC, thereby increasing integration density of the IC. It should be noted that the protection circuit has no discrete transistor and that the N+-type region 31 operates as both the resistor $R_{11}$ and the collector of the distributed transistors $Q_{11}$, $Q_{12}$ ... $Q_{1n}$. The area occupied by the protection circuit is additionally decreased by these distributed elements and dual use of the regions. Further, since it is not necessary to increase the resistance of the resistor, the operation speed of the MOS FET $Q_{20}$ is not limited to a slow speed. Additionally, the operation speed may be improved by decreasing the resistance of the resistor $R_{11}$.

If an abnormally high negative voltage is applied to the input terminal 101, the applied voltage forwardly biases the distributed diodes $D_{11}$, $D_{12}$ ... $D_{1n}$ to bypass the input signal. Consequently, the voltage applied to the MOS FET $Q_{20}$ is lowered. This protection action is similar to the conventional protection circuit shown in FIGS. 1, 2 and 3.

Figure 5:
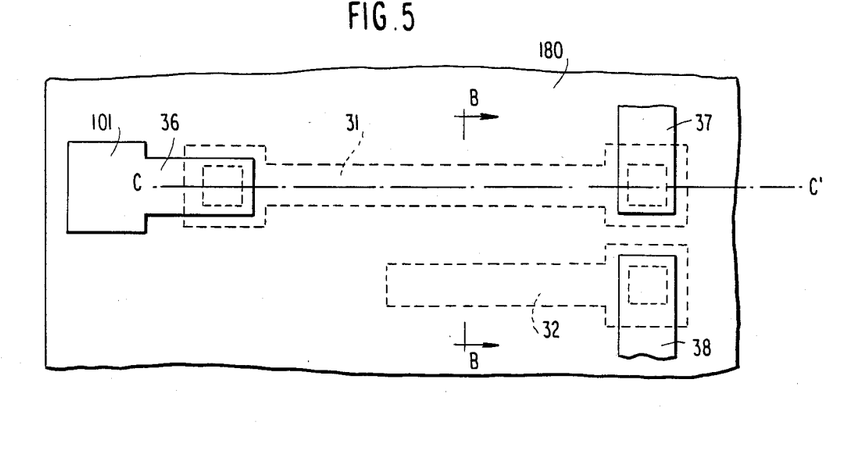
FIG. 5 is a plan view of the input portion of the IC shown in FIG. 4.
Figure 6A:
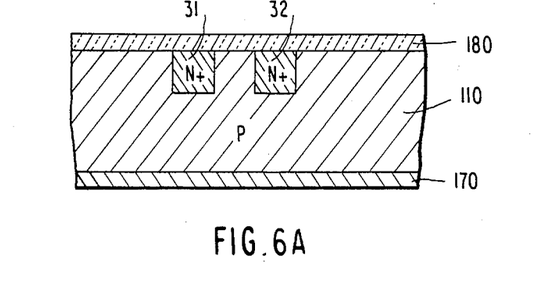
FIGS. 6A and 6B are sectional views of the IC shown in FIG. 5 taken along lines B-B' and C-C', respectively, in FIG. 5.
Figure 6B:
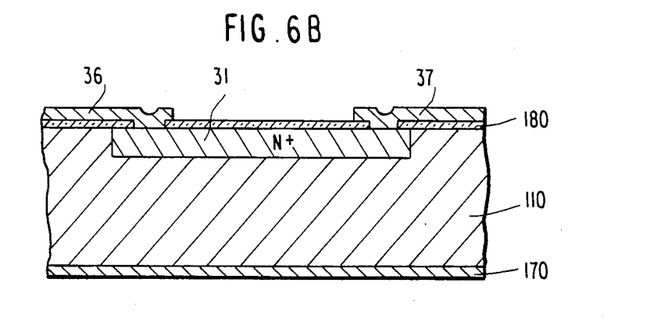
Figure 7:
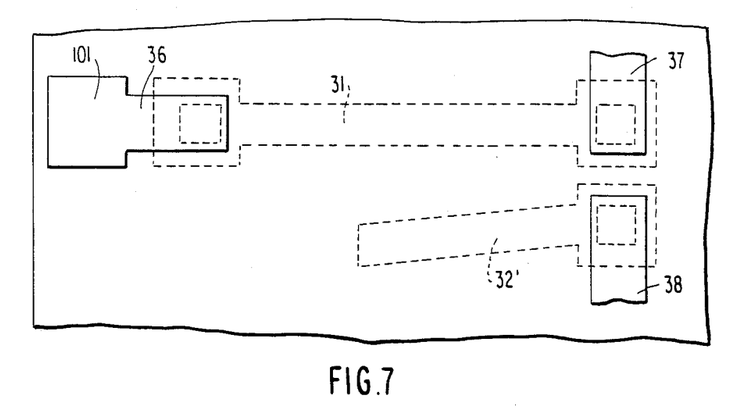
FIG. 7 is a plan view of an input portion of an IC according to a second embodiment of the present invention.

FIG. 7 shows a second embodiment of the present invention in FIG. 7, reference numerals used commonly in FIG. 5 identify like elements. The equivalent circuit of the protection circuit of FIG. 7 is similar to the circuit depicted in FIG. 4. The difference from the first embodiment relates to the N+ region 32'. Specifically, the region 32' is not disposed parallel to the region 31. The farther from the contact portion on the right of the region 32', the larger is the distance between the regions 31 and 32'. As a result, the distributed transistors positioned far from the contact portion of the region 32' have large base widths and small current gains compared to the distributed transistors close to the contact portion of the region 32'.

If an abnormally high voltage is applied to the input terminal 101, higher voltages are applied to the distributed transistors far from the contact portion of the region 32', compared to the distributed transistors positioned closer to the contact portion. However, the distributed transistors applied with the higher voltages have less current gain. Consequently, relatively large current flows are obtained through the distributed transistors positioned close to the contact portion. Here, the distributed transistors close to the contact portion receive lower voltages at their collectors compared to the distributed transistors far from the contact portion. As a result, none of the distributed transistors are damaged, even by a considerably high voltage. Although the currents flowing through the distributed transistors in the second embodiment are not evenly distributed since the current flows along the entire side of the N+ region 32'. The second embodiment also has features similar to the first embodiments.

Figure 8A:
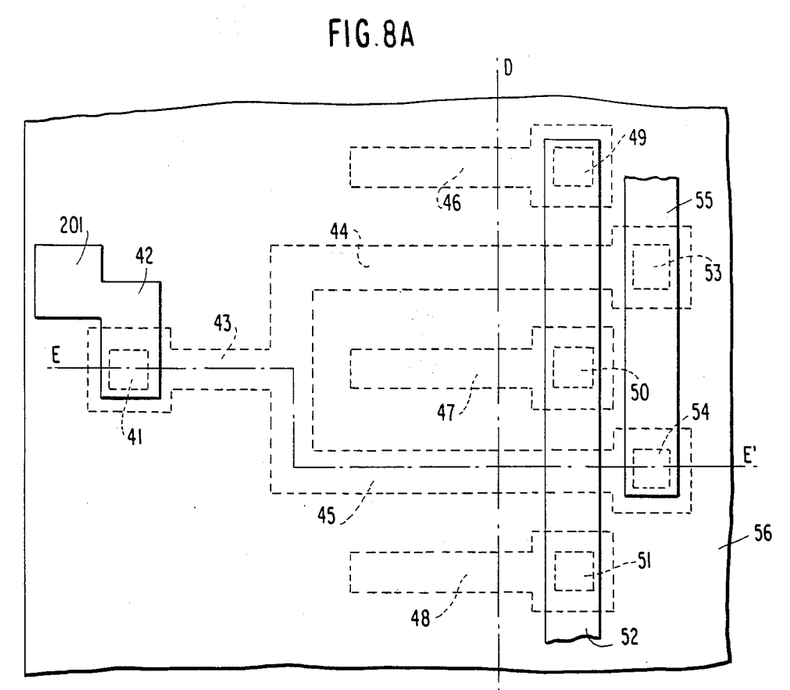
FIG. 8A is a plan view of an input portion of an IC according to a third embodiment of the present invention.
Figure 8B:
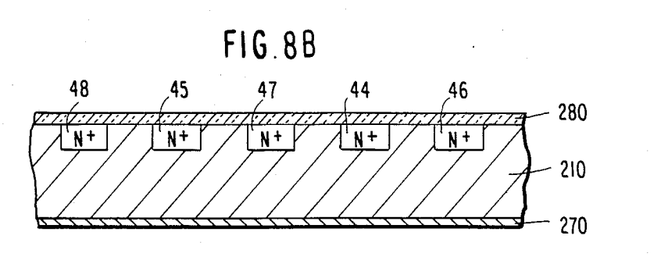
FIGS. 8B and 8C are sectional views of this input portion taken along lines D-D' and E-E', respectively, in FIG. 8A.
Figure 8C:
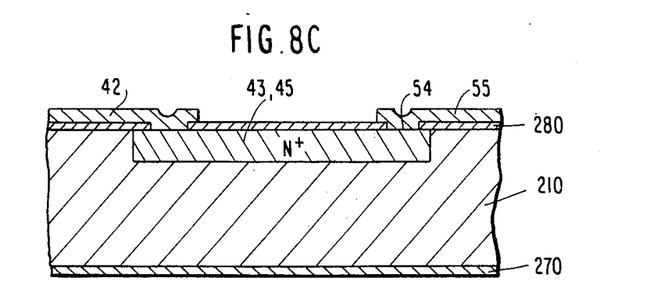

FIGS. 8A through 8C show a third embodiment of the present invention. The region which equivalently operates as the resistor $R_{11}$ shown in FIG. 4 is constructed by N+ regions 43, 44 and 45. The N+ region 43 has an end portion 41 connected to an input terminal 201 through a wiring layer 42 and another end portion contacting the N+ regions 44 and 45. The N+ regions 44 and 45 have end portions 53 and 54 connected with a wiring layer 55 which is connected in turn to a gate electrode of a MOS FET.

The region which equivalently operates as the resistor $R_{12}$ of FIG. 4 is composed of three separate N+ regions 46, 47 and 48. The N+ regions 46, 47 and 48 and the N+ regions 44 and 45 are disposed alternately and in parallel. The N+ regions 46, 47 and 48 have respective end portions 49, 50 and 51 which are connected to a wiring layer 52. The wiring layer 52 is, in turn, connected to a terminal which receives a ground potential.

The difference of this third embodiment from the first and second embodiments is that the regions operating as the resistors $R_{11}$ and $R_{12}$ are respectively composed of a plural number of respective N+ regions which are electrically connected in parallel. Due to this parallel arrangement, the distributed transistors are formed between the N+ regions 44 and 46, between the N+ regions 44 and 47, between the N+ regions 45 and 48, and between the N+ regions 45 and 47. As a result, compared to the first embodiment, the area of the distributed transistors is increased by a factor of four and the area of the distributed diodes is increased by a factor of two times. The current capacities of the distributed transistors and diodes are also increased by four times and two times, respectively. Consequently, the protection circuit of the third embodiment more reliably protects the MOS FET connected thereto and survives a higher input voltage, compared to the first and second embodiments. Further, due to the parallel arrangement of the N+ regions 44 and 45, the resistance between the end portion 41 and the wiring layer 55 is decreased, resulting in an improvement in operation speed of the MOS FET connected to wiring layer 55.

It should be noted that the numbers of the N+ regions disposed in parallel is not limited to the numbers used in the third embodiment. The numbers may be arbitrarily selected in accordance with the characteristics required for the IC.

Figure 9:
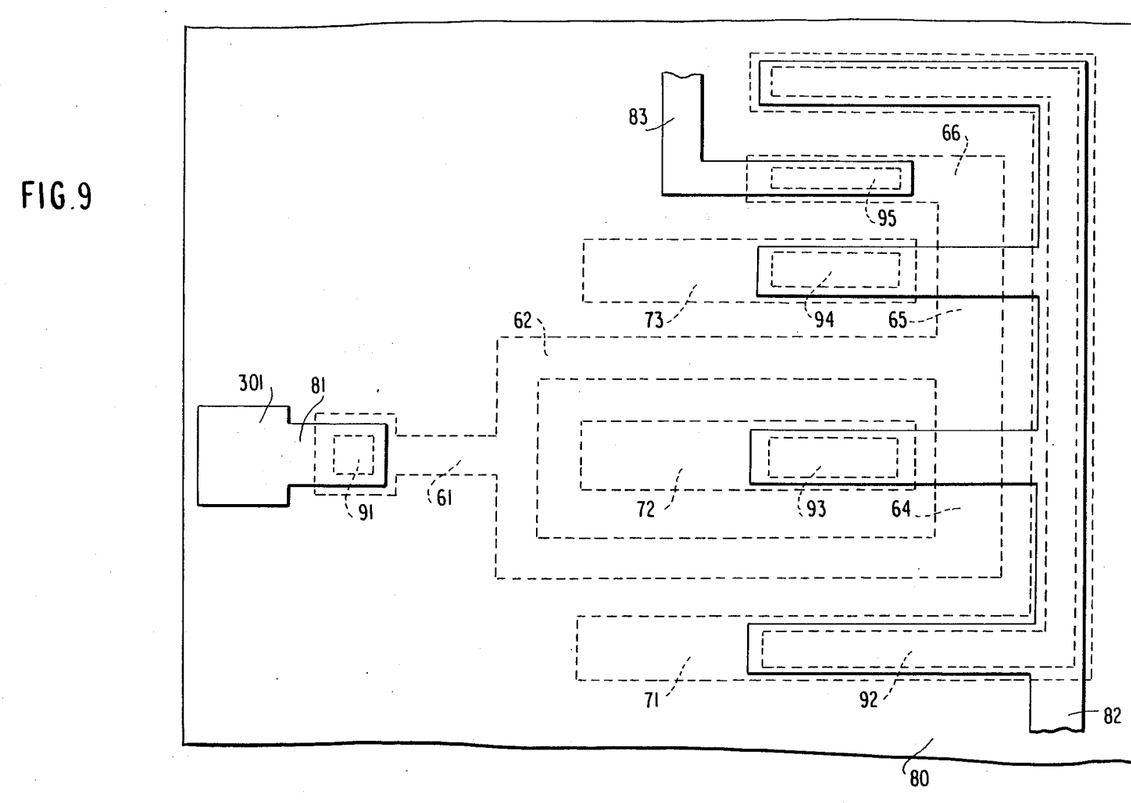
FIG. 9 is a plan view of an input portion of an IC according to a fourth embodiment of the present invention.

The protection circuit according to a fourth embodiment of the present invention is shown in FIG. 9. An input terminal 301 and a wiring layer 81 are provided on an insulator film 80 which is formed on the surface of a P-type silicon substrate having an impurity concentration of $2\times10^{15}$ cm$^{-3}$. The wiring layer 81 is connected to the N+ region 61 at a contact portion 91 through an aperture in the insulator film 80. Two parallely disposed N+ regions 62 and 63 are connected to the N+ regions 61 and 64 at their respective ends. The N+ region 64 continues to N+ regions 65 and 66. The N+ region 66 has a relatively long contact portion 95 at which the N+ region 66 is connected to a wiring layer 83, and, in turn to a MOS FET which is to be protected from an abnormal high voltage applied to the input terminal 301. These N+ regions 61 to 66 form the resistor $R_{11}$ of FIG. 4. In more detail, the resistor $R_{11}$ in FIG. 9 is composed of a first series resistor of the region 61, first and second parallel resistors of the region 62 and the regions 63 and 64, a second series resistor of the region 65 and a collector of a discrete transistor formed by the region 66.

N+ region 71 is formed outside the N+ regions 63 to 66 extending parallel thereto. The N+ region 71 has a very long contact portion 92 to which a wiring layer 82 is connected. The N+ region 71 also has free end portion positioned close to the input terminal 301. An N+ region 72 is disposed between the N+ regions 62 and 63, extending parallel thereto. The N+ region 72 has a free end portion on the side of the input terminal 301 and a long contact portion on the other side to which the wiring layer is connected. Another N+ region 73 is formed between the N+ regions 62 and 66. This N+ region 73 also has a free end portion on the side of the input terminal 301 and a long contact portion 94 to which the wiring layer is connected. These N+ regions 71, 72 and 73, except for the portions facing the N+ region 66, operate as the resistor $R_{12}$ of FIG. 4. In other words, this embodiments has three resistors $R_{12}$. The portions of the N+ regions 71 and 73 facing the N+ regions 66 operate as emitters of the discrete transistor $Q_1$ shown in FIG. 1. Since the N+ region 65 operates as the resistor $R_1$ shown in FIG. 1, the protection circuit of the fourth embodiment provides a series connection of two kinds of protection circuits. One is of the type of the third embodiment and is composed of the N+ regions 61, 62, 63 and 64 and the N+ regions 71, 72 and 72. The other is a conventional type as shown in FIG. 1 and is composed of the N+ regions 65 and 66 and the N+ regions 71 and 73.

All the N+ regions 61 to 66 and 71 to 73 have an impurity concentration of $10^{20}$ cm$^{-3}$. The N+ regions 62 and 63 have a length of about 200 μm. The composite resistance between the contact holes 91 and 95 is selected in a range from 500 ohms to 3 kilohms. The free end portions of the N+ regions 71 and 72 have a length from 50 μm to 150 μm, for example, 100 μm. The distances between the N+ regions 62 and 63 and the N+ regions 71, 72 and 73 are selected in a range of 5 to 50 μm, for example, 15 μm.

According to the fourth embodiment, the protection circuit is a combination of two types of protection circuits. The abnormally high voltage input applied to the input terminal 301 is bypassed to ground by the first protection circuit of the type of the third embodiment, and further bypassed by the second protection circuit of the conventional type. In this way, the input voltage is twice reduced. Therefore, the voltage obtained at the wiring layer 83 is reduced very reliably. The protection of the MOS FET connected with the wiring layer 81 is more complete.

The distance between the N+ region operating as the resistor $R_{11}$ of FIG. 4 and the N+ region operating as the resistor $R_{12}$ should not be made sufficiently small that punch-through occurs between the N+ regions. This is because punch-through destroys the PN-junctions of the N+ regions so that the N+ regions do not operate as transistors. The punch-through voltage can be expressed as follows:

$$V_{PT} = qN_pW^2/2\epsilon s \tag{1}$$

Where $N_p$ is the impurity concentration of the substrate between the N+ regions, $\epsilon s$ is the dielectric constant of the semiconductor substrate, q is the electron charge and W is the distance between the N+ regions. In other words, the distance W should be selected to satisfy the following relation:

$$W > \sqrt{\frac{2\epsilon s V_{PT}}{qN_p}} \tag{2}$$

In a practical case, this distance W should be more than 5 μm.

On the other hand, if the distance W is too large, the N+ regions cannot operate as transistors. For this reason, distance should be less than 50 μm. As a result, a useful device should have distance W in the range of 5 μm to 50 μm.

Further, if the free end portion of the N+ region operating as the resistor $R_{12}$ of FIG. 4 is too short, the distributed transistors cannot have a sufficient current capacity. The free end portion which does not directly contact the wiring layer connected to the ground terminal should have a length more than 50 μm and less than 150 μm. For a free end portion length in the range of 50 μm to 150 μm, both the N+ regions should have a spacing of 5 μm to 50 μm.

As explained above, the protection circuit according to the present invention has two impurity regions disposed closely to each other. The two impurity regions operate as both resistors and distributed transistors, and one of them operates as distributed diodes. Therefore, the protection circuit reliably reduces the voltage of an abnormally high input signal to provide absolute protection to the transistor to be protected. The protection circuit itself cannot be destroyed by the abnormally high input signal. The operation speed of the transistor to be protected is not decreased because the resistance of the protection circuit is not increased. Finally, the protection circuit can be realized on an IC chip with a reduced area.

It is apparent for the skilled in the art that the conductivities of the N+ regions and the P-type silicon substrate can be reversed to apply the invention to an IC constructed with P channel MOS FETs.

What is claimed is:

1. A semiconductor device provided with a protection circuit, the semiconductor device comprising:
   a semiconductor substrate of one conductivity type;
   a field effect transistor formed in said semiconductor substrate, said field effect transistor having a source and a drain formed in said semiconductor substrate and a gate formed on said semiconductor substrate between said source and said drain via an insulating film;
   a first terminal formed on said semiconductor substrate for connecting with an external circuit;

a first region of the other conductivity type formed in said semiconductor substrate, said first region having a first and a second end portion and an elongated intermediate portion extending between said first and second end portions;

first means for connecting said first terminal with said first end portion of said first region;

second means for connecting said second end portion of said first region with said gate of said field effect transistor;

a second region of said other conductivity type formed in said semiconductor substrate, said second region having an elongated portion extending parallel to said intermediate portion of said first region with a distance therebetween determined such that said elongated portion of said second region and said intermediate portion of said first region operate as a distributed bipolar lateral transistor together with a portion of said semiconductor substrate located therebetween, said second region further having a contact portion at one end of said elongated portion, said elongated portion having no direct electrical connection thereto;

a second terminal formed on said semiconductor substrate for receiving a reference voltage; and third means for connecting said contact portion of said second region with said second terminal.

2. The semiconductor device as claimed in claim 1, wherein said contact portion of said second region is located adjacent to said second end portion of said first region.

3. The semiconductor device as claimed in claim 1, wherein said distance between said elongated portion and said intermediate portion is in a range of 5 $\mu$m to 50 $\mu$m.

4. The semiconductor device as claimed in claim 3, wherein said elongated portion of said second region has a length between 50 $\mu$m and 150 $\mu$m.

5. The semiconductor device as claimed in claim 1, further comprising a third region of said other conductivity type formed in said semiconductor substrate having an elongated portion extending parallel to said intermediate portion of said first region and a contact portion electrically connected to said contact portion of said second region.

6. The semiconductor device as claimed in claim 1, wherein said first region further has another elongated portion connected with said first end portion of said first region, an end of said other elongated portion being electrically connected with said second end portion of said first region, said other elongated portion extending parallel to said elongated portion of said second region to form a distributed bipolar lateral transistor.

7. The semiconductor device as claimed in claim 6, said semiconductor device further comprising a third region of said other conductivity type formed in said semiconductor substrate, said third region having an elongated portion extending parallel to said other elongated portion of said first region to form a concentrated bipolar lateral transistor therebetween and an end portion electrically connected to said contact portion of said second region.

8. A semiconductor device comprising: a semiconductor substrate, a field effect transistor formed in said semiconductor substrate, an input terminal formed on said semiconductor substrate, a reference potential terminal formed on said semiconductor substrate, a first elongated resistor region of one conductivity type formed in a semiconductor region of the opposite conductivity type, one end of said first elongated resistor region being electrically connected to said input terminal and the other end of said first elongated resistor region being electrically connected to a gate of said field effect transistor, and a second elongated resistor region extending along said first elongated resistor region, one end of said second elongated resistor region being free from electrical contact and the other end of said second elongated resistor region being electrically connected to said reference potential terminal.

9. The semiconductor device of claim 8, wherein a distance between said first and second elongated resistor regions differs along the length of said second elongated resistor region.

10. The semiconductor device of claim 9, wherein said distance is largest between said one end of said second elongated resistor region and said first elongated region.

* * * * *

UNITED STATES PATENT AND TRADEMARK OFFICE
CERTIFICATE OF CORRECTION

PATENT NO. : 4,656,491

DATED : April 7, 1987

INVENTOR(S) : Hatsuhide Igarashi

It is certified that error appears in the above-identified patent and that said Letters Patent is hereby corrected as shown below:

COLUMN 1, LINE 28  After "terminal" insert --3--
COLUMN 2, LINE 35  After "speed" insert --of--
COLUMN 2, LINE 47  After "damage" insert --to--
COLUMN 2, LINE 51  After "A" delete "The"
COLUMN 2, LINE 54  After "by" insert --the--
COLUMN 2, LINE 61  Delete "is required" after "for"
COLUMN 2, LINE 61  Insert --is required-- before "for"
COLUMN 3, LINE 5   Delete "within" insert --in--
COLUMN 3, LINE 4'  After second occurrence of "the" insert --area--
COLUMN 3, LINE 49  Delete "with" insert --will--
COLUMN 3, LINE 51  After "will" insert --not--
COLUMN 6, LINE 18  After "32'" delete "." insert --,--
                   Delete "The" insert --the--
COLUMN 6, LINE 40  Delete "respectively"

UNITED STATES PATENT AND TRADEMARK OFFICE
CERTIFICATE OF CORRECTION

PATENT NO. :  4,656,491

DATED      :  April 7, 1987

INVENTOR(S) :  Hatsuhide Igarashi

It is certified that error appears in the above-identified patent and that said Letters Patent is hereby corrected as shown below:

COLUMN 6, LINE 45   Delete "48" insert --47--

COLUMN 6, LINE 46   Delete "47" insert --48--

COLUMN 6, LINE 50   Delete "times"

Signed and Sealed this

Eighth Day of March, 1988

Attest:

DONALD J. QUIGG

Attesting Officer

Commissioner of Patents and Trademarks